US012563805B2

(12) United States Patent
Che et al.

(10) Patent No.: US 12,563,805 B2
(45) Date of Patent: Feb. 24, 2026

(54) METHOD FOR FABRICATING FULLY DEPLETED SILICON-ON-INSULATOR PMOS DEVICES

(71) Applicant: Shanghai Huali Integrated Circuit Corporation, Shanghai (CN)

(72) Inventors: Siyuan Che, Shanghai (CN); Xiangguo Meng, Shanghai (CN); Lian Lu, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 381 days.

(21) Appl. No.: 18/341,694

(22) Filed: Jun. 26, 2023

(65) Prior Publication Data

US 2024/0186402 A1     Jun. 6, 2024

(30) Foreign Application Priority Data

Dec. 5, 2022    (CN) .......................... 202211546769.4

(51) Int. Cl.
H10D 64/01        (2025.01)
H10D 62/832        (2025.01)

(52) U.S. Cl.
CPC ......... H10D 64/017 (2025.01); H10D 62/832 (2025.01)

(58) Field of Classification Search
CPC .... H10D 30/021; H10D 30/60; H10D 64/021; H10D 62/832
See application file for complete search history.

(56) References Cited

U.S. PATENT DOCUMENTS

| | | | | | |
|---|---|---|---|---|---|
| 5,998,289 | A | * | 12/1999 | Sagnes | ................ H01L 21/2807 257/407 |
| 6,391,748 | B1 | * | 5/2002 | Temkin | ............. H01L 21/02513 257/E21.127 |
| 2013/0193514 | A1 | * | 8/2013 | Loubet | ................. H10D 30/021 438/479 |
| 2013/0341722 | A1 | * | 12/2013 | Illgen | .................. H10D 86/201 257/351 |
| 2024/0186402 | A1 | * | 6/2024 | Che | ....................... H10D 62/832 |

FOREIGN PATENT DOCUMENTS

| | | | | |
|---|---|---|---|---|
| CN | 109950256 | * | 11/2020 | ............. H01L 27/12 |
| CN | 11156133 | * | 6/2024 | ........... H10D 62/832 |

* cited by examiner

*Primary Examiner* — Mary A Wilczewski
(74) *Attorney, Agent, or Firm* — Banner & Witcoff, Ltd.

(57)        ABSTRACT

The present application discloses a method for fabricating fully depleted silicon-on-insulator PMOS devices, the method includes sequentially forming a polysilicon layer and a hard mask oxide layer on an FDSOI substrate structure; etching to a SiGe layer by using the hard mask oxide layer as a mask to form a PMOS gate stack structure; sequentially depositing a spacer dielectric layer and an epitaxial hard mask; performing photolithography and etching to remove the epitaxial hard mask above the PMOS gate stack and thin the spacer dielectric layer; performing in situ photo resist strip; and etching to remove a residual spacer dielectric layer above the PMOS gate and on its surrounding substrate. The present application can effectively reduce the accumulative loss of a SiGe substrate after the epitaxial hard mask etching, improving the epitaxial growth of PMOS regions and ensuring the performance of the fabricated fully depleted silicon-on-insulator PMOS devices.

8 Claims, 3 Drawing Sheets

METHOD FOR FABRICATING FULLY DEPLETED SILICON-ON-INSULATOR PMOS DEVICES

CROSS-REFERENCES TO RELATED APPLICATIONS

This application claims the priority to Chinese patent application No. CN 202211546769.4, filed on Dec. 5, 2022, and entitled "METHOD FOR FABRICATING FULLY DEPLETED SILICON-ON-INSULATOR PMOS DEVICES", the disclosure of which is incorporated herein by reference in entirety.

TECHNICAL FIELD

The present application relates to the semiconductor fabrication technology, and in particular, to a method for fabricating fully depleted silicon-on-insulator PMOS devices.

BACKGROUND

In order to increase the stress in a channel for FDSOI (Fully Depleted Silicon-on-Insulator) PMOS devices, a silicon-germanium (SiGe)-channel and metal-gate process has been used, where a source-drain region is formed by a selective SiGe epitaxy in which a SiGe layer is epitaxially grown on a silicon surface. as a result the PMOS hole mobility is increased and the saturation current by the compressive stress generated due to the mismatch in lattice constants of silicon and germanium atoms.

For FDSOI PMOS devices, a silicon substrate is replaced with a SiGe alloy to form a SiGe-on-insulator (SGOI) structure for improving the carrier mobility and reducing the leakage current. However, in the existing process there are two etching steps on the spacers and the epitaxial hard masks (EPI HM) performed, while SiGe is intact before those etchings, about 34% of the SiGe is lost after the spacer etching, in addition, the remaining SiGe can be almost completely lost after the epitaxial hard mask (EPI HM) etching. This is because the presence of a photo resist (PR) in the epitaxial hard mask (EPI HM) etching process can reduce the etch selectivity ratio of SiN (silicon nitride) to SiGe, which causes about 50%. increase in the SiGe loss. The accumulative loss of the SiGe eventually leads to little epitaxial growth of PMOS regions, so when etching the contact hole (CT), it will directly penetrate to the lower insulation layer.

BRIEF SUMMARY

The present application provides a method for fabricating fully depleted silicon-on-insulator PMOS devices, which effectively reduces the accumulative loss of a SiGe substrate after the epitaxial hard mask etching, improving the epitaxial growth in PMOS devices and ensuring the performance of the fabricated fully depleted silicon-on-insulator PMOS devices.

The method for fabricating fully depleted silicon-on-insulator PMOS devices includes the following steps:

S1. providing an FDSOI substrate structure including a bulk silicon layer 10, a buried oxide layer 11, and a SiGe layer 12, wherein the buried oxide layer 11 is formed on the surface of the bulk silicon layer 10, and the SiGe layer 12 is formed on the surface of the buried oxide layer 11;

S2. sequentially forming a polysilicon layer 14 and a hard mask oxide layer 16 on the FDSOI substrate structure;

S3. etching to the SiGe layer 12 by using the hard mask oxide layer 16 as a mask to form a PMOS gate stack structure;

S4. sequentially depositing a spacer dielectric layer 17 and an epitaxial hard mask 18;

S5. performing photolithography and etching to remove the epitaxial hard mask 18 above the PMOS gate stack and thin the spacer dielectric layer 17, and remove the epitaxial hard mask 18 on the substrate surrounding the PMOS gate and thin the spacer dielectric layer 17;

S6. performing in-situ photo resist strip; and

S7. etching to remove a residual spacer dielectric layer 17 above the PMOS gate and on its surrounding substrate.

According to one embodiment, in step S3, in etching to the SiGe layer 12 by using the hard mask oxide layer 16 as a mask, a NMOS gate stack structure is also formed:

in step S5, by photolithography and plasma etching, the epitaxial hard mask 18 above the PMOS gate and on its surrounding substrate are removed and the spacer dielectric layer 17 is thinned, and the epitaxial hard mask 18 above the NMOS gate and on its surrounding substrate and the spacer dielectric layer 17 are retained:

in S6. in-situ photo resist strip is performed; and in S7. plasma etching is performed to remove the residual spacer dielectric layer 17 above and around the PMOS gate, and plasma etching is simultaneously performed to thin the epitaxial hard mask (EPI HM) 18 above the NMOS gate and on its surrounding substrate.

According to one embodiment, the thickness of the spacer dielectric layer 17 is less than that of the epitaxial hard mask 18.

According to one embodiment, the material of the spacer dielectric layer 17 is SiO or SiCN, with a thickness of 40 Å to 60 Å; and The material of the epitaxial hard mask 18 is SiN with a thickness in range of 50 Å to 70 Å.

According to one embodiment, in S2, a polysilicon layer 14, a silicon nitride layer 15 and a hard mask oxide layer 16 are sequentially formed on the FDSOI substrate structure.

According to one embodiment, in S2, a PMOS work function adjusting metal layer 13, the polysilicon layer 14, the silicon nitride layer 15 and the hard mask oxide layer 16 are sequentially formed on the FDSOI substrate structure.

According to one embodiment, the PMOS power adjusting metal layer 13 is grown by using an atomic layer deposition process.

According to one embodiment, the PMOS work function adjusting metal layer 13 is TiN.

In the method of the present application for fabricating fully depleted silicon-on-insulator PMOS devices, the etching steps for the spacer dielectric layer 17 and epitaxial hard mask (EPI HM) 18 of the PMOS gate are combined as a single step, partial etching is performed first for the epitaxial hard mask (EPI HM) 18 of the PMOS gate, then in-situ PR strip is performed, and then etching is continued for the remaining spacer dielectric layer 17 above the PMOS gate and on its surrounding substrate; and during the fabrication of fully depleted silicon-on-insulator PMOS devices, the accumulative loss of the SiGe substrate after the epitaxial hard mask (EPI HM) etching due to twice etching can be effectively reduced, and the loss of SiGe substrate after the epitaxial hard mask (EPI HM) etching due to a reduced selection ratio of SiN to SiGe caused by the presence of a photo resist (PR, Photo Resist) can be effectively reduced, facilitating the epitaxial growth of PMOS regions and ensuring the performance of the fabricated fully depleted silicon-on-insulator PMOS devices.

BRIEF DESCRIPTION OF THE DRAWINGS

The FIG.s to be used in the present application is described in brief below in order to more clearly illustrate the technical solution of the application. Obviously, the FIG.s in the following description are only some embodiments of the present application. On that basis, other FIG.s can be obtained by those of ordinary skill in the art without creative work.

Figure 1:
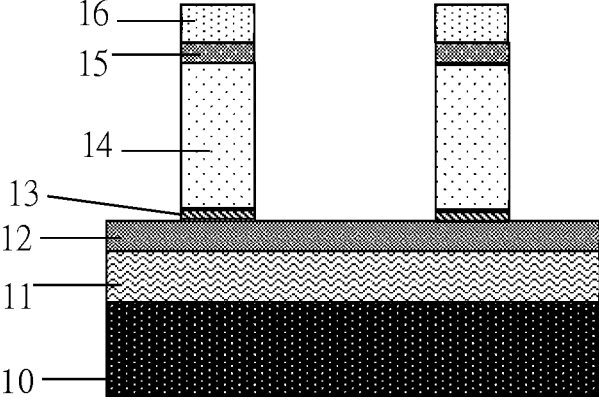
FIG. 1 is a structural schematic diagram of the gate stack according to one embodiment of the method for fabricating fully depleted silicon-on-insulator PMOS devices.

The reference numerals in the FIG.s are listed below:

10 a bulk silicon layer; 11 a buried oxide layer; 12 a SiGe layer; 13 a PMOS work function adjusting metal layer; 14 a polysilicon layer; 15 a silicon nitride layer; 16 a hard mask oxide layer; 17 a spacer dielectric layer; 18 an epitaxial hard mask; and 19 a photo resist.

DETAILED DESCRIPTION OF THE DISCLOSURE

The technical solution in the embodiments of the present application is fully described below in conjunction with the FIG.s in the embodiments. Obviously, the described embodiments are only a part of the embodiments of the present application. Based on the embodiments in the present application, all other embodiments obtained by a person of ordinary skill in the art without creative work fall within the scope of protection of the present application.

The terms "first", "second" and the like used in the present application do not indicate any order, number or importance, but are only used to distinguish different components. The words "including", "comprising" and the like are intended to mean that the elements or objects before the words encompass the components, objects or equivalents thereof listed after the words, not excluding other components or objects. The words "connecting", "coupling" or the like are not limited to physical or mechanical connections, but may include electrical connections, either directly or indirectly. "Upper", "lower", "left", "right", or the like are used only to indicate relative position relationships, and when the absolute position of the described object is changed, the relative position relationship may also be changed accordingly.

It should be noted that the embodiments in the present application and the features therein can be combined with each other without contradictory.

Example I

Figure 2:
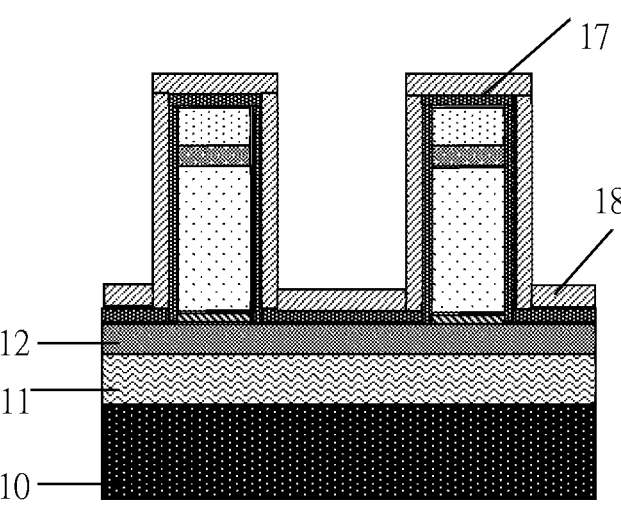
FIG. 2 is a schematic diagram of the structure after depositing a spacer dielectric layer and an epitaxial hard mask according the method of the present application.
Figure 3:
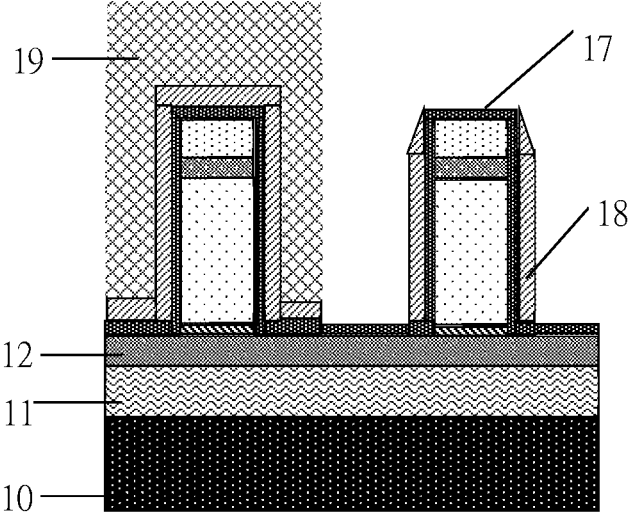
FIG. 3 is a schematic diagram of the structure after removing the epitaxial hard mask of a PMOS gate and thinning a spacer dielectric layer according to the method.
Figure 4:
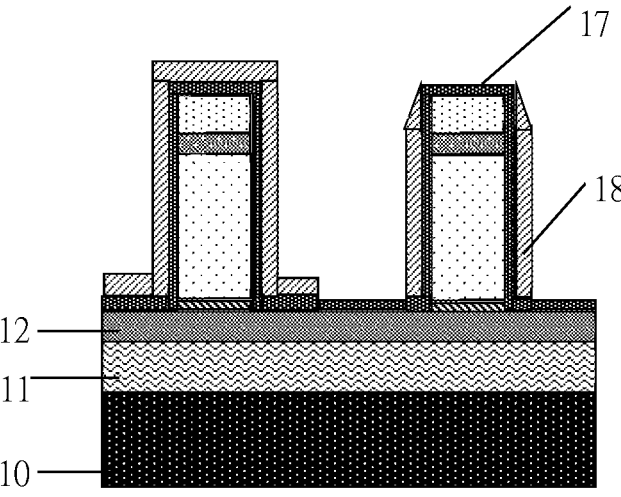
FIG. 4 is a schematic diagram of the structure after photo resist stripping according to the method.
Figure 5:
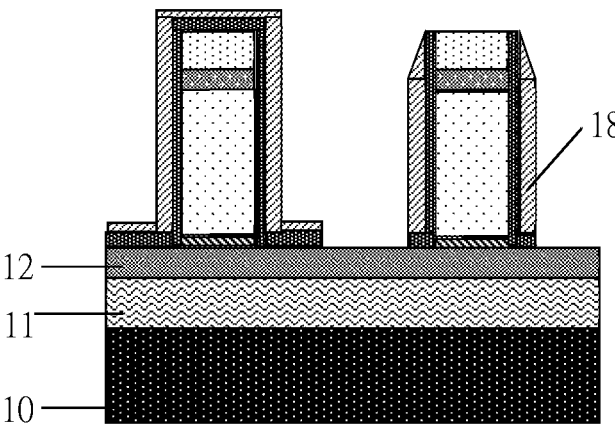
FIG. 5 is a schematic diagram of the structure after etching to remove a residual spacer dielectric layer above and around the PMOS gate according to the method.

A method for fabricating fully depleted silicon-on-insulator (FDSOI) PMOS devices, including the steps of:

S1. providing an FDSOI substrate structure including a bulk silicon layer (SI) 10, a buried oxide layer (SiO₂) 11, and a SiGe layer (SiGe) 12, wherein the buried oxide layer 11 is formed on the surface of the bulk silicon layer 10 and the SiGe layer 12 is formed on the surface of the buried oxide layer 11;

S2. sequentially forming a polysilicon layer (POLY) 14 and a hard mask oxide layer (HM OX) 16 on the FDSOI substrate structure;

S3. etching to the SiGe layer 12 by using the hard mask oxide layer 16 as a mask to form a PMOS gate stack structure as shown in FIG. 1;

S4. sequentially depositing a spacer dielectric layer 17 and an epitaxial hard mask (EPI HM) 18, as shown in FIG. 2;

S5. performing photolithography and etching to remove the epitaxial hard mask (EPI HM) 18 above the PMOS gate stack and thin the spacer dielectric layer 17, and remove the epitaxial hard mask (EPI HM) 18 on the substrate surrounding the PMOS gate and thin the spacer dielectric layer 17, as shown in FIG. 3;

S6. performing in-situ photo resist strip (in-situ PR strip), as shown in FIG. 4; and S7. etching to remove the residual spacer dielectric layer 17 above the PMOS gate and on its surrounding substrate, as shown in FIG. 5.

In the method of example 1 for fabricating fully depleted silicon-on-insulator PMOS devices, the etching steps for the spacer dielectric layer 17 and the epitaxial hard mask (EPI HM) 18 of the PMOS gate are combined as a single step, partial etching is performed first for the epitaxial hard mask (EPI HM) 18 of the PMOS gate, then in-situ PR strip is performed, and then etching is continued for the remaining spacer dielectric layer 17 above the PMOS gate and on its surrounding substrate; and during the fabrication of fully depleted silicon-on-insulator PMOS devices, the accumulative loss of the SiGe substrate after the epitaxial hard mask (EPI HM) etching due to twice etching can be effectively reduced, and the loss of SiGe substrate after the epitaxial hard mask (EPI HM) etching due to a reduced selection ratio of SiN to SiGe caused by the presence of a photo resist (PR, Photo Resist) can be effectively reduced, enabling the epitaxial growth of PMOS regions and ensuring the performance of the fabricated fully depleted silicon-on-insulator PMOS devices.

It is confirmed in practice that the loss of the SiGe substrate caused by etching the spacer (Spacer1) and epitaxial hard mask (EPI HM) during fabrication of fully depleted silicon-on-insulator (FDSOI) devices is reduced by this optimizing method, with the loss of the SiGe substrate reduced from 75 Å to 17 Å, an improvement of 77.3%.

Example II

On the basis of the method for fabricating fully depleted silicon-on-insulator PMOS devices of example I, in step S3, in etching to the SiGe layer 12 by using a hard mask oxide layer 16 as a mask, an NMOS gate stack structure is also formed;

in step S5, photolithography and plasma etching are performed to remove the epitaxial hard mask (EPI HM) 18 above the PMOS gate and on its surrounding substrate and thin the spacer dielectric layer 17, retaining the epitaxial hard mask (EPI HM) 18 above the NMOS gate and on its surrounding substrate and the spacer dielectric layer 17;

S6. in-situ photo resist strip (in-situ PR strip) is performed; and

S7. plasma etching is performed to remove the residual spacer dielectric layer 17 above the PMOS gate and on its surrounding substrate, and plasma etching is simultaneously performed to thin the epitaxial hard mask (EPI HM) 18 above the NMOS gate and on its surrounding substrate.

Example III

On the basis of the method for fabricating fully depleted silicon-on-insulator PMOS devices of example I, the thickness of the spacer dielectric layer 17 is less than that of the epitaxial hard mask (EPI HM) 18.

According the example, the spacer dielectric layer 17 is SiO or SiCN, with a thickness of 40 Å to 60 Å (e.g., 50 Å).

According to the example, the epitaxial hard mask (EPI HM) 18 is a SiN with a thickness of 50 Å to 70 Å (e.g., 60 Å).

Example IV

On the basis of the method for fabricating fully depleted silicon-on-insulator PMOS devices of example I, in S2, a polysilicon layer 14, a silicon nitride layer (SiN) 15, and a hard mask oxide layer 16 are sequentially formed on the FDSOI substrate structure.

According to the example, in S2, a PMOS work function adjusting metal layer (p-type work function metal) 13, the polysilicon layer 14, the silicon nitride layer (SiN) 15 and the hard mask oxide layer 16 are formed sequentially on the FDSOI substrate structure.

According to the example, the PMOS work function adjusting metal layer 13 is grown by using an atomic layer deposition (ALD) process.

According to the example, the material of the PMOS function adjusting metal layer 13 is TiN.

Only preferred embodiments of the present application are described above, and are not intended to limit the present application. Any modification, equivalent substitution, improvement, etc. made within the spirit and principle of the present application shall be covered within the scope of protection of the present application.

What is claimed is:

1. A method for fabricating fully depleted silicon-on-insulator (FDSOI) PMOS devices, comprising steps of:

S1: providing an FDSOI substrate structure comprising a bulk silicon layer (10), a buried oxide layer (11), and a SiGe layer (12), wherein the buried oxide layer (11) is formed on a surface of the bulk silicon layer (10), and the SiGe layer (12) is formed on a surface of the buried oxide layer (11);

S2: sequentially forming a polysilicon layer (14), and a hard mask oxide layer (16) on the FDSOI substrate structure;

S3: etching by using the hard mask oxide layer (16) as a mask to form a PMOS gate stack and an NMOS gate stack next to the PMOS gate stack on the SiGe layer (12);

S4: sequentially depositing a spacer dielectric layer (17) and an epitaxial hard mask (18) over the PMOS gate stack and the NMOS gate stack and the SiGe layer (12) around the PMOS gate stack and the NMOS gate stack;

S5: performing photolithography with a photoresist layer (19) covering the NMOS gate stack;

performing etching to remove the epitaxial hard mask (18) from above the PMOS gate stack and from above a surface of the SiGe layer (12) around the PMOS gate stack, and to thin the spacer dielectric layer (17) from above the PMOS gate stack and from above the surface of the SiGe layer (12) around the PMOS gate stack;

S6: performing an in-situ photo resist strip process to expose the NMOS gate stack; 3 and S7: performing etching to remove residual spacer dielectric layer (17) from above the PMOS gate and from above the surface of the SiGe layer (12) around the PMOS gate stack.

2. The method for fabricating the fully depleted silicon-on-insulator PMOS devices according to claim 1, wherein, in step S5, the epitaxial hard mask (18) and the spacer dielectric layer (17) above the NMOS gate stack and above the surface of the SiGe layer (12) around the NMOS gate stack are retained under the photoresist layer (19);

wherein the etching in step S7 simultaneously thins the epitaxial hard mask (18) from above the NMOS gate stack, and wherein the etching is plasma etching.

3. The method for fabricating the fully depleted silicon-on-insulator PMOS devices according to claim 1, wherein: a thickness of the spacer dielectric layer (17) is less than a thickness of the epitaxial hard mask (18).

4. The method for fabricating the fully depleted silicon-on-insulator PMOS devices according to claim 3, wherein a material of the spacer dielectric layer (17) comprises one of SiO and SiCN, having a thickness in a range of 40 Å to 60 Å; and wherein a material of the epitaxial hard mask (18) comprises SiN having a thickness in a range of 50 Å to 70 Å.

5. The method for fabricating the fully depleted silicon-on-insulator PMOS devices according to claim 3, wherein step S2 further comprises forming a silicon nitride layer (15) between the polysilicon layer (14) and the hard mask oxide layer (16).

6. The method for fabricating the fully depleted silicon-on-insulator PMOS devices according to claim 3, wherein step S2 further comprises forming sequentially a PMOS work function adjusting metal layer (13) before the polysilicon layer (14) and a silicon nitride layer (15) between the polysilicon layer (14) and the hard mask oxide layer (16).

7. The method for fabricating the fully depleted silicon-on-insulator PMOS devices according to claim 6, wherein the PMOS work function adjusting metal layer (13) is grown by an atomic layer deposition process.

8. The method for fabricating the fully depleted silicon-on-insulator PMOS devices according to claim 6, wherein a material of the PMOS work function adjusting metal layer (13) comprises TiN.

* * * * *